(12) United States Patent
Tanikawa et al.

(10) Patent No.: US 9,337,019 B2
(45) Date of Patent: May 10, 2016

(54) METHOD FOR MANUFACTURING ELECTRONIC COMPONENT, AND ELECTRONIC COMPONENT

(71) Applicant: SEKISUI CHEMICAL CO., LTD., Osaka, Osaka (JP)

(72) Inventors: Mitsuru Tanikawa, Osaka (JP); Takashi Watanabe, Osaka (JP); Michihisa Ueda, Osaka (JP); Shigeru Nakamura, Shiga (JP); Hiroshi Maenaka, Osaka (JP); Ryosuke Takahashi, Osaka (JP); Takanori Inoue, Osaka (JP); Yoshito Fujita, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 14/778,935

(22) PCT Filed: Nov. 18, 2014

(86) PCT No.: PCT/JP2014/080434
§ 371 (c)(1),
(2) Date: Sep. 21, 2015

(87) PCT Pub. No.: WO2015/076235
PCT Pub. Date: May 28, 2015

(65) Prior Publication Data
US 2016/0049297 A1 Feb. 18, 2016

(30) Foreign Application Priority Data
Nov. 19, 2013 (JP) .................... 2013-239164

(51) Int. Cl.
*H01L 21/00* (2006.01)
*H01L 21/02* (2006.01)
(Continued)

(52) U.S. Cl.
CPC .......... *H01L 21/02288* (2013.01); *H01L 21/52* (2013.01); *H01L 21/78* (2013.01)

(58) Field of Classification Search
CPC .. H01L 21/187; H01L 23/3735; H01L 41/312
USPC .......................................................... 438/118
See application file for complete search history.

(56) References Cited

U.S. PATENT DOCUMENTS

| 2008/0104832 A1 | 5/2008 | Shintate |
| 2010/0073437 A1 | 3/2010 | Shibata et al. |

(Continued)

FOREIGN PATENT DOCUMENTS

| JP | 2008-117997 A | 5/2008 |
| JP | 2009-279848 A | 12/2009 |

(Continued)

OTHER PUBLICATIONS

International Search Report for the Application No. PCT/JP2014/080434 mailed Feb. 24, 2015.

(Continued)

*Primary Examiner* — Elias M Ullah
(74) *Attorney, Agent, or Firm* — Cheng Law Group, PLLC

(57) ABSTRACT

Provided is a method for producing an electronic component, which is capable of forming a cured adhesive layer easily with high accuracy.
The method for producing a curable film electronic component according to the present invention includes an application step in which an adhesive is applied onto a first electronic component body using an ink jet device to form an adhesive layer, a first light irradiation step in which an adhesive layer is irradiated with light from a first light irradiation part, an attachment step in which a second electronic component body is disposed on the adhesive layer irradiated with light and attached, and a step in which the adhesive layer is cured by heating, thereby giving an electronic component, the ink jet device includes an ink tank to store the adhesive, a discharge part, and a circulation flow path part, and in the application step, the adhesive is applied while being circulated in the ink jet device.

16 Claims, 4 Drawing Sheets

(51) Int. Cl.
  *H01L 21/52* (2006.01)
  *H01L 21/78* (2006.01)

(56) References Cited

U.S. PATENT DOCUMENTS

2012/0248634 A1 10/2012 Mitsukura et al.
2012/0256326 A1 10/2012 Mitsukura et al.
2012/0263946 A1 10/2012 Mitsukura et al.

FOREIGN PATENT DOCUMENTS

| JP | 2010-254763 A | 11/2010 |
| WO | WO-2011/024720 A1 | 3/2011 |
| WO | WO-2011/058996 A1 | 5/2011 |
| WO | WO-2013/042632 A1 | 3/2013 |

OTHER PUBLICATIONS

Written Opinion of the International Searching Authority (PCT/ISA/237) for Application No. PCT/JP2014/080434 mailed Feb. 24, 2015.

(a)

(b)

(c)

(d)

(e)

METHOD FOR MANUFACTURING ELECTRONIC COMPONENT, AND ELECTRONIC COMPONENT

TECHNICAL FIELD

The present invention relates to a method for producing an electronic component, according to which two electronic component bodies are joined together using an adhesive that is photocurable and thermocurable. The present invention also relates to an electronic component obtained by the method for producing an electronic component.

BACKGROUND ART

A semiconductor device having a semiconductor chip laminated on a substrate through a cured product layer is known. In addition, a semiconductor device having a plurality of semiconductor chips laminated through a cured product layer is widely known.

The semiconductor device is produced as follows. With a curable composition layer (adhesive layer) being laminated on the lower surface of a semiconductor chip, the semiconductor chip provided with a curable composition layer is laminated on a substrate or a semiconductor chip from the curable composition layer side, and the curable composition layer is cured. An example of such a semiconductor device production method is disclosed, for example, in the below-listed Patent Document 1.

In addition, a semiconductor device may also be produced as follows, for example. A curable composition is applied onto a substrate or a semiconductor chip by a dispenser or screen printing to form a curable composition layer, then a semiconductor chip is laminated on the curable composition layer, and the curable composition layer is cured.

RELATED ART DOCUMENT

Patent Document

Patent Document 1: WO2011/058996 A1

SUMMARY OF THE INVENTION

Problems to be Solved by the Invention

According to the conventional method for producing a semiconductor device mentioned above, the tact time is long, making it difficult to efficiently produce a semiconductor device. Further, the thickness accuracy tends to be low, whereby the adhesive layer may protrude, or the surface smoothness may not be obtained, leading to the formation of voids. Accordingly, the adhesion reliability between each layers in a semiconductor device may be reduced.

In particular, in a production method in which a curable composition is applied by a dispenser or screen printing, there is a problem in that it is difficult to apply a curable composition with uniform thickness.

An object of the present invention is to provide a method for producing an electronic component, which is capable of forming a cured adhesive layer easily with high accuracy. Another object of the present invention is to provide an electronic component obtained by the method for producing an electronic component.

Means for Solving the Problems

According to a wide aspect of the present invention, provided is a method for producing an electronic component, including: an application step in which an adhesive that is photocurable and thermocurable and also is in liquid form is applied onto a first electronic component body using an ink jet device to form an adhesive layer; a first light irradiation step in which, after the application step, the adhesive layer is irradiated with light from a first light irradiation part to allow the curing of the adhesive layer to proceed; an attachment step in which, after the first light irradiation step, a second electronic component body is disposed on the adhesive layer irradiated with light, and pressure is applied to attach the first electronic component body and the second electronic component body through the adhesive layer irradiated with light, thereby giving a primary laminate; and a heating step in which, after the attachment step, the primary laminate is heated to cure the adhesive layer between the first electronic component body and the second electronic component body, thereby giving an electronic component, the ink jet device including: an ink tank to store the adhesive; a discharge part that is connected to the ink tank and discharges the adhesive; and a circulation flow path part that is connected to the discharge part at one end and connected to the ink tank at the other end, through which the adhesive flows, the application step being such that, in the ink jet device, the adhesive is moved from the ink tank to the discharge part, and then the adhesive that has not been discharged from the discharge part is moved through the circulation flow path part to the ink tank, whereby the adhesive is applied while being circulated.

In a specific aspect of the method for producing an electronic component according to the present invention, the method for producing an electronic component mentioned above further includes, after the first light irradiation step and before the attachment step, a second light irradiation step in which the adhesive irradiated with light from the first light irradiation part is irradiated with light from a second light irradiation part that is different from the first light irradiation part to allow the curing of the adhesive to further proceed.

In a specific aspect of the method for producing an electronic component according to the present invention, the circulation flow path part includes, in the circulation flow path part, a buffer tank to temporarily store the adhesive.

In a specific aspect of the method for producing an electronic component according to the present invention, the temperature of the adhesive during circulation is 40° C. or more and 100° C. or less.

In a specific aspect of the method for producing an electronic component according to the present invention, the ink jet device is an ink jet device using a piezoelectric ink jet head, and, in the application step, the adhesive is applied by the action of a piezo element.

In a specific aspect of the method for producing an electronic component according to the present invention, in the attachment step, the pressure applied during attachment is 0.01 MPa or more and 10 MPa or less.

In a specific aspect of the method for producing an electronic component according to the present invention, in the attachment step, the temperature during attachment is 30° C. or more and 180° C. or less.

In a specific aspect of the method for producing an electronic component according to the present invention, the viscosity of the adhesive during discharge is 3 mPa·s or more and 2000 mPa·s or less.

In a specific aspect of the method for producing an electronic component according to the present invention, the adhesive contains a photocurable compound, a thermocurable compound, a photopolymerization initiator, and a thermal curing agent. In a specific aspect of the method for producing an electronic component according to the present invention, the adhesive contains the photocurable compound, a photo- and thermocurable compound, the thermocurable compound, the photopolymerization initiator, and the thermal curing agent.

In a specific aspect of the method for producing an electronic component according to the present invention, the photocurable compound has a (meth)acryloyl group, the photo- and thermocurable compound has a (meth)acryloyl group and a cyclic ether group, and the thermocurable compound has a cyclic ether group.

In a specific aspect of the method for producing an electronic component according to the present invention, the adhesive contains, as the photocurable compounds, a monofunctional compound having one (meth)acryloyl group and a multifunctional compound having two or more (meth)acryloyl groups.

In a specific aspect of the method for producing an electronic component according to the present invention, the total of the photocurable compound content and the photo- and thermocurable compound content is 10 wt % or more and 80 wt % or less based on 100 wt % of the adhesive.

In a specific aspect of the method for producing an electronic component according to the present invention, the first electronic component body is a circuit board or a semiconductor wafer after dicing. In another specific aspect, the second electronic component body is a semiconductor wafer after dicing.

In a specific aspect of the method for producing an electronic component according to the present invention, an electronic component for a semiconductor device is obtained.

According to a wide aspect of the present invention, provided is an electronic component obtained by the method for producing an electronic component mentioned above.

Effect of the Invention

In the method for producing an electronic component according to the present invention, an application step in which an adhesive that is photocurable and thermocurable and also is in liquid form is applied using an ink jet device is performed, followed by the first light irradiation step, the attachment step, and the heating step. Further, the ink jet device includes the ink tank, the discharge part, and the circulation flow path part. In the application step, in the ink jet device, the adhesive is moved from the ink tank to the discharge part, and then the adhesive that has not been discharged from the discharge part is moved through the circulation flow path part to the ink tank, whereby the adhesive is applied while being circulated. As a result, a cured adhesive layer can be formed easily with high accuracy.

MODE(S) FOR CARRYING OUT THE INVENTION

Figure 1:
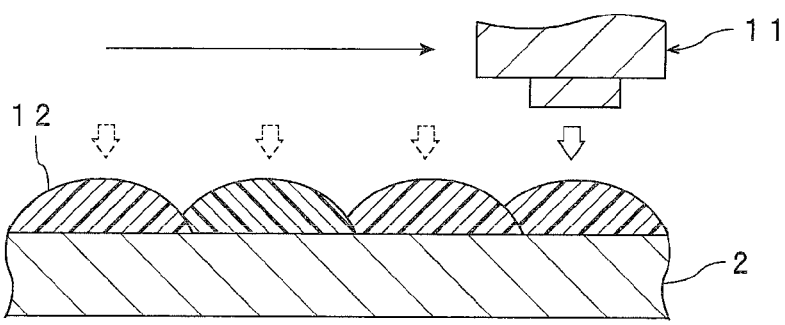
FIGS. 1(a) to (e) are cross-sectional views for explaining each step of a method for producing an electronic component according to one embodiment of the present invention.
Figure 1:
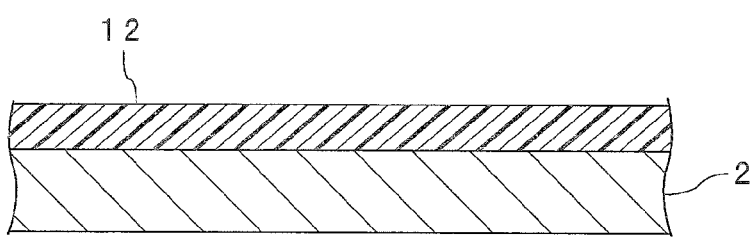
Figure 1:
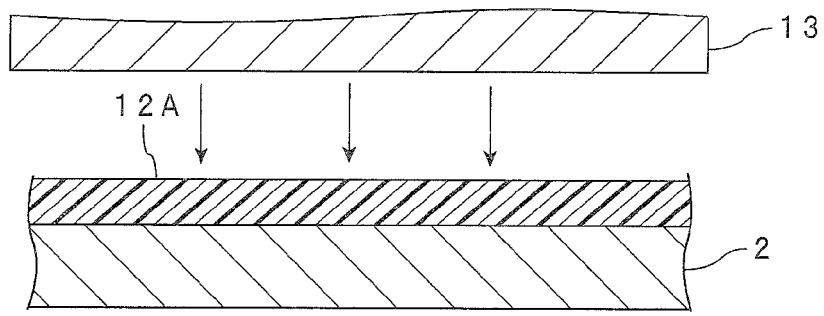
Figure 1:
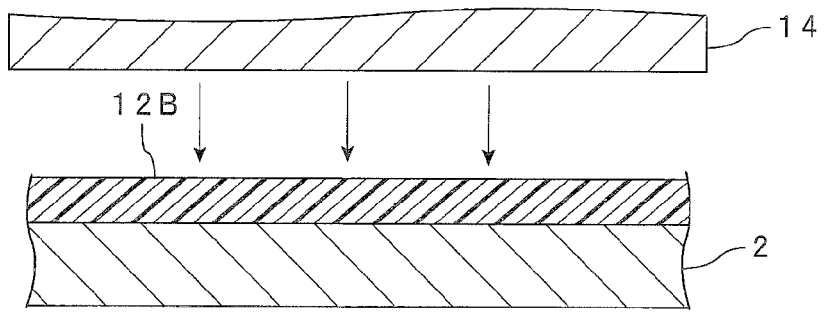
Figure 1:
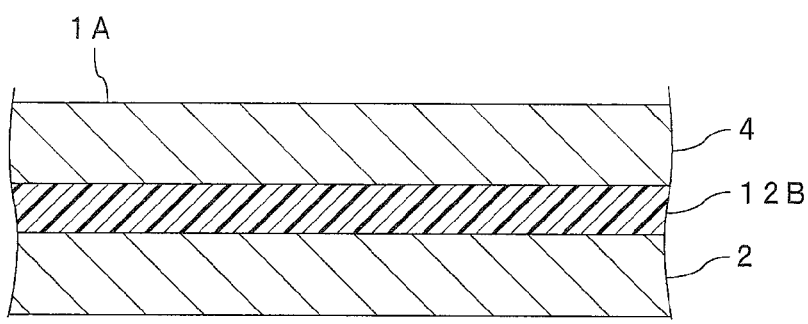

Hereinafter, the present invention will be described in detail.

The method for producing an electronic component according to the present invention includes an application step in which an adhesive that is photocurable and thermocurable and also is in liquid form is applied onto a first electronic component body to form an adhesive layer. The method for producing an electronic component according to the present invention also includes a first light irradiation step in which, after the application step, the adhesive layer is irradiated with light from a first light irradiation part to allow the curing of the adhesive layer to proceed. The method for producing an electronic component according to the present invention further includes an attachment step in which, after the first light irradiation step, a second electronic component body is disposed on the adhesive layer irradiated with light, and pressure is applied to attach the first electronic component body and the second electronic component body through the adhesive layer irradiated with light, thereby giving a primary laminate. The method for producing an electronic component according to the present invention further includes a heating step in which, after the attachment step, the primary laminate is heated to cure the adhesive layer between the first electronic component body and the second electronic component body, thereby giving an electronic component. As a result of the heating step, a cured adhesive layer is formed.

In addition, in the method for producing an electronic component according to the present invention, the ink jet device includes an ink tank to store the adhesive, a discharge part that is connected to the ink tank and discharges the adhesive, and a circulation flow path part that is connected to the discharge part at one end and connected to the ink tank at the other end, through which the adhesive flows.

In the method for producing an electronic component according to the present invention, in the application step, in the ink jet device, the adhesive is moved from the ink tank to the discharge part, and then the adhesive that has not been discharged from the discharge part is moved through the circulation flow path part to the ink tank, whereby the adhesive is applied while being circulated.

In the present invention, the above specific application step, the above specific first light irradiation step, the above specific attachment step, and the above specific heating step are performed. Further, using the above specific ink jet device, in the ink jet device, the adhesive is moved from the ink tank to the discharge part, and then the adhesive that has not been discharged from the discharge part is moved through the circulation flow path part to the ink tank, whereby the adhesive is applied while being circulated. As a result, a cured adhesive layer can be formed easily with high accuracy. For obtaining the effect of the present invention, the application of the adhesive while being circulated is significantly meaningful.

In addition, in the present invention, a thick adhesive layer can be formed with high accuracy. In addition, in the present invention, a multilayered adhesive layer can also be formed finely with high accuracy.

Hereinafter, the present invention will be clarified with reference to the drawings through the description of specific embodiments and examples of the present invention.

Figure 2:
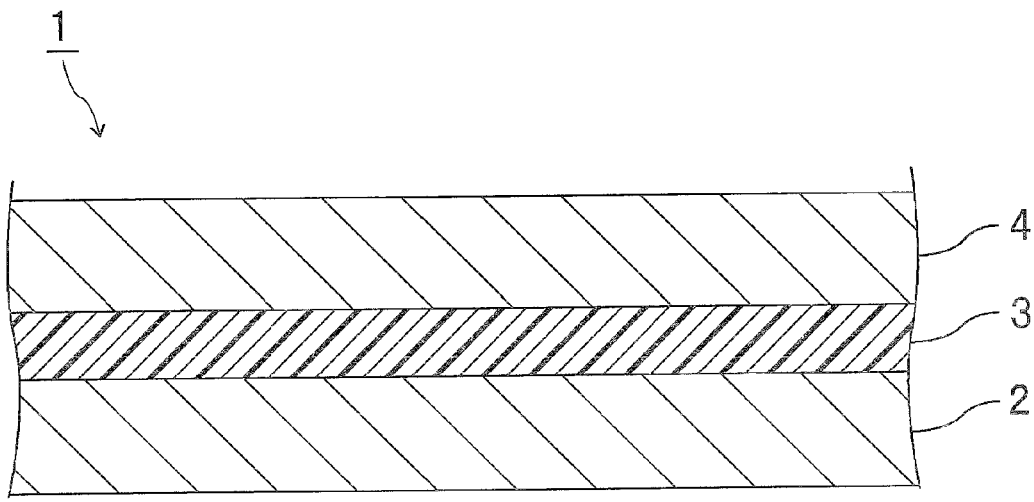
FIG. 2 is a front cross-sectional view schematically showing an electronic component obtained by a method for producing an electronic component according to one embodiment of the present invention.

FIG. 2 is a cross-sectional view showing an electronic component obtained by a method for producing an electronic component according to one embodiment of the present invention.

The electronic component 1 shown in FIG. 2 is provided with a first electronic component body 2, an adhesive layer 3 disposed on the surface of the first electronic component body 2, and a second electronic component body 4 disposed on the surface of the adhesive layer 3. The second electronic component body 4 is disposed on the surface opposite to the first electronic component body 2 side of the adhesive layer 3. The first electronic component body 2 is disposed on the first surface of the adhesive layer 3. The second electronic component body 4 is disposed on the second surface of the adhesive layer 3, which is opposite to the first surface. The adhesive layer 3 is an adhesive layer after heating and is a cured adhesive layer.

The electronic component body may be, specifically, a semiconductor wafer, a semiconductor wafer after dicing (divided semiconductor wafer, semiconductor chip), a cover glass, a condenser, a diode, a printed circuit board, a flexible printed circuit board, a glass epoxy substrate, a glass substrate, or the like.

Because an adhesive layer formed with high accuracy is particularly required, it is preferable that the electronic component body is a circuit board, a cover glass, a semiconductor wafer, or a semiconductor wafer after dicing.

Because an adhesive layer formed with high accuracy is particularly required, it is preferable that the first electronic component body is a circuit board or a semiconductor wafer after dicing. Because an adhesive layer formed with high accuracy is particularly required, it is preferable that the second electronic component body is a semiconductor wafer after dicing.

Because an adhesive layer formed with high accuracy is particularly required, it is preferable that the first electronic component body is a circuit board or a semiconductor wafer after dicing, and the second electronic component body is a semiconductor wafer after dicing. Further, it is more preferable that the first electronic component body is a circuit board, and the second electronic component body is a semiconductor wafer after dicing. It is preferable that the electronic component is an electronic component for a semiconductor device.

Hereinafter, a method for producing an electronic component according to one embodiment of the present invention will be described.

First, as shown in FIG. 1(a), an adhesive that is photocurable and thermocurable and also is in liquid form is applied onto a first electronic component body 2 using an ink jet device 11 to form an adhesive layer 12 (application step). Here, the adhesive is applied onto the entire surface of the first electronic component body 2. After the application, droplets of the adhesive mix with each other to form the adhesive layer 12 in the state shown in FIG. 1(b).

Figure 3:
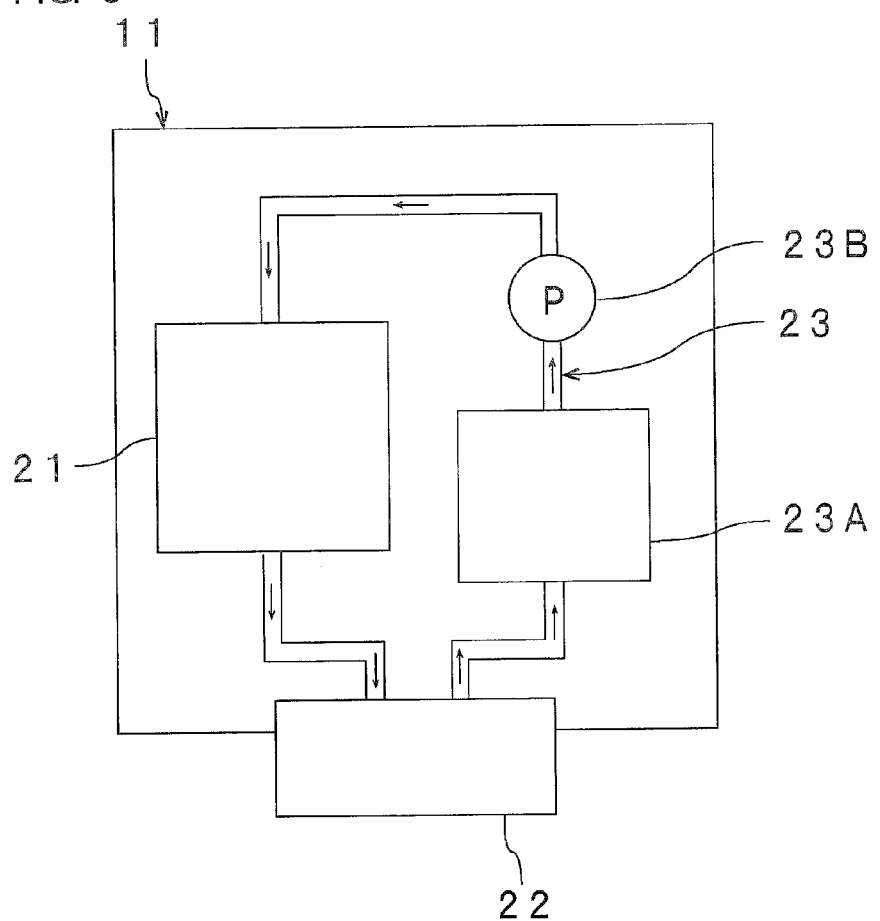
FIG. 3 is a schematic block diagram showing an example of an ink jet device used in a method for producing an electronic component according to one embodiment of the present invention.

As shown in FIG. 3, the ink jet device 11 internally has an ink tank 21, a discharge part 22, and a circulation flow path part 23.

Figure 4:
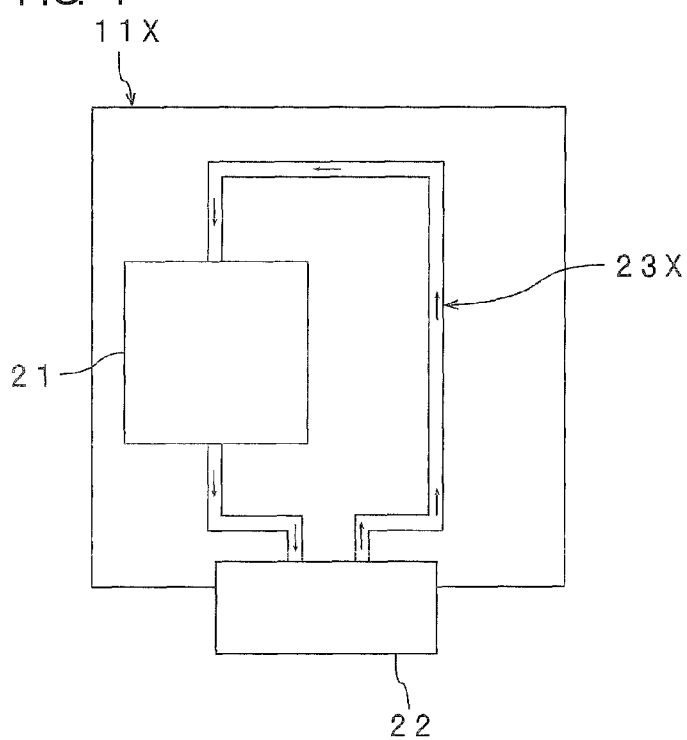
FIG. 4 is a schematic block diagram showing another example of an ink jet device used in a method for producing an electronic component according to one embodiment of the present invention.

The circulation flow path part 23 has a buffer tank 23A and a pump 23B in the circulation flow path part 23. However, like the ink jet device 11X shown in FIG. 4, the circulation flow path part 23X may have no buffer tank or pump in the circulation flow path part 23X. The circulation flow path part preferably has the buffer tank and preferably has the pump in the circulation flow path part. In addition to the buffer tank and the pump, the circulation flow path part may also have a flowmeter, a thermometer, a filter, a level sensor, and the like in the circulation flow path part.

The ink tank 21 stores the adhesive. The adhesive is discharged from the discharge part 22 (ink jet head). The discharge part 22 includes a discharge nozzle. The discharge part 22 is connected to the ink tank 21. The ink tank 21 and the discharge part 22 are connected to each other through a flow path. One end of the circulation flow path part 23 is connected to the discharge part 22, while the other end is connected to the ink tank 21. The adhesive flows through the circulation flow path part 23.

In the case where the buffer tank 23A or the pump 23B is included, it is preferable that the buffer tank 23A and the pump 23B are each disposed between the discharge part 22 and the ink tank 21. The buffer tank 23A is disposed closer to the discharge part 22 than is the pump 23B. The pump 23B is disposed closer to the ink tank 21 than is the buffer tank 23A. The buffer tank 23A temporarily stores the adhesive.

The discharge part may be an ink jet head, for example, such as a thermal head, a bubble jet head, a solenoid valve head, or a piezoelectric head. In addition, the circulation flow path part in the discharge part may be an end-shooter type, in which discharge nozzles are branched from a common circulation flow path (manifold), or a side-shooter type, in which an ink circulates through a discharge nozzle. In terms of increasing the dischargeability of the adhesive to further increase the formation accuracy of a fine adhesive layer, it is preferable that the inkjet device is an inkjet device using a piezoelectric ink jet head, and that, in the application step, the adhesive is applied by the action of a piezo element.

As a method for circulating the adhesive, it is possible to utilize the ink's own weight or perform circulation by pressurization, depressurization, or the like using a pump or the like. It is also possible to use a combination of some of them. The pump may be a cylinder-type nonpulsatile pump, a propeller pump, a gear pump, a diaphragm pump, or the like. In terms of increasing the circulation efficiency to further increase the formation accuracy of a fine adhesive layer, it is preferable that the circulation flow path part includes, in the circulation flow path part, a pump that transfers the adhesive.

In the discharge nozzle of the discharge part, it is preferable that a suitable pressure is maintained, and also that there is not much pressure fluctuation (pulsation) within the range. In the case of using a pump or the like, in order to suppress the pulsation of the pump, it is preferable to provide a damper between the pump and the discharge part. Such a damper may be a buffer tank to temporarily store the adhesive, a membrane-type damper, or the like.

In terms of forming a cured adhesive layer with even higher accuracy, it is preferable that the circulation flow path part includes, in the circulation flow path part, a buffer tank to temporarily store the adhesive.

In the case where the adhesive is circulated with heating, it is possible to introduce a heating heater in the ink tank 21 or use a heating heater in the circulation flow path part 23 or 23X, thereby adjusting the temperature of the adhesive.

In the application step, in the ink jet device 11, the adhesive is moved from the ink tank 21 to the discharge part 22, and then the adhesive that has not been discharged from the discharge part 22 is passed through the circulation flow path part 23 and moved to the ink tank 21. As a result, the adhesive is applied while being circulated in the application step.

Next, as shown in FIGS. 1(b) and (c), after the application step, the adhesive layer 12 is irradiated with light from a first light irradiation part 13 to allow the curing of the adhesive layer 12 to proceed (first light irradiation step). This results in the formation of an adhesive layer 12A irradiated with light from the first light irradiation part 13. The adhesive layer 12A is a precured product. In the case where light is applied from the below-described second light irradiation part 14, the wavelength and irradiation intensity of the light from the first light irradiation part 13 may be the same as or different from the wavelength and irradiation intensity of the light from the below-described second light irradiation part 14. In terms of further increasing the curability of the adhesive layer, it is preferable that the irradiation intensity of the light from the second light irradiation part 14 is higher than the irradiation intensity of the light from the first light irradiation part 13. In the case of using a photocurable compound and a photo- and thermocurable compound, in order to control photocurability, it is preferable to perform the first light irradiation step and the below-described second light irradiation step.

Incidentally, the description "the adhesive layer 12 is irradiated with light from a first light irradiation part 13 to allow the curing of the adhesive layer 12 to proceed" also includes that the reaction is allowed to proceed to create a thickened state.

The apparatus for light irradiation is not particularly limited, and may be an ultraviolet light-emitting diode (UV-LED), a metal halide lamp, a high-pressure mercury lamp, an extra-high pressure mercury lamp, or the like. In terms of further increasing the formation accuracy of the adhesive layer, it is particularly preferable to use a UV-LED as the first light irradiation part.

Next, as shown in FIGS. 1(c) and (d), after the first light irradiation step, the adhesive layer 12A irradiated with light from the first light irradiation part 13 is irradiated with light from a second light irradiation part 14 that is different from the first light irradiation part 13 to allow the curing of the adhesive layer 12A to further proceed (second light irradiation step). This results in the formation of an adhesive layer 12B irradiated with light from the second light irradiation part 14. The adhesive layer 12B is a precured product.

The second light irradiation step is preferably performed before the below-described attachment step, and is preferably performed before the heating step. In terms of forming a cured adhesive layer with even higher accuracy, it is preferable that the second light irradiation step is performed. However, the second light irradiation step does not necessarily have to be performed, and it is also possible that the below-described attachment step is performed after the first light irradiation step without performing the second light irradiation step.

Next, as shown in FIGS. 1(d) and (e), after the second light irradiation step, a second electronic component body 4 is disposed on the adhesive layer 12B irradiated with light, and pressure is applied to attach the first electronic component body 2 and the second electronic component body 4 through the adhesive layer 12B irradiated with light, thereby giving a primary laminate 1A (attachment step). Incidentally, in the case where the second light irradiation step is not performed after the first light irradiation step, the second electronic component body 4 is disposed on the adhesive layer 12A irradiated with light, and pressure is applied to attach the first electronic component body 2 and the second electronic component body 4 through the adhesive layer 12A irradiated with light, thereby giving a primary laminate (attachment step).

Next, after the attachment step, the primary laminate 1A is heated to cure the adhesive layer 12B between the first electronic component body 2 and the second electronic component body 4, thereby giving an electronic component (heating step). In this manner, the electronic component 1 shown in FIG. 2 can be obtained.

Figure 5:
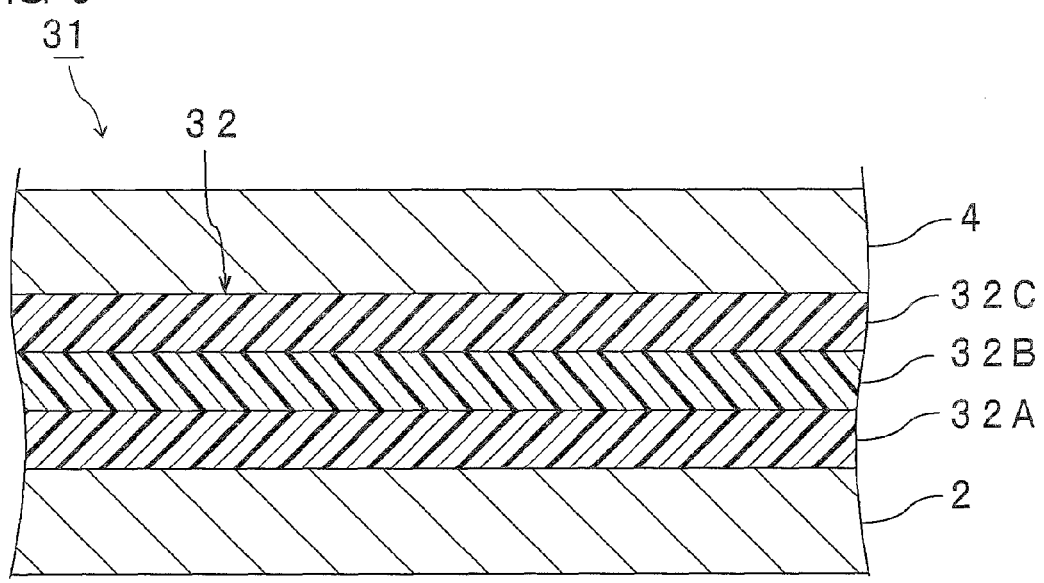
FIG. 5 is a front cross-sectional view schematically showing an electronic component obtained by a method for producing an electronic component according to another embodiment of the present invention.

Incidentally, the application step and the first light irradiation step may be repeated to increase the number of layers of the adhesive layer, thereby forming a multilayer adhesive layer. As shown in FIG. 5, an electronic component 31 provided with an adhesive layer 32 including a laminate of a plurality of adhesive layers 32A, 32B, and 32C may be obtained.

In the method for producing an electronic component, in terms of increasing the dischargeability and transportability of the adhesive to form a cured adhesive layer with even higher accuracy, it is preferable that the temperature of the adhesive during circulation is 30° C. or more, more preferably 40° C. or more, and 120° C. or less, more preferably 100° C. or less.

In terms of increasing the dischargeability of the adhesive to form a cured adhesive layer with even higher accuracy, it is preferable that the viscosity of the adhesive during discharge is 3 mPa·s or more, more preferably 5 mPa·s or more, and 2000 mPa·s or less, more preferably 1500 mPa·s or less.

The viscosity is measured in accordance with JIS K2283 using an E-type viscometer ("TVE22L" manufactured by Toki Sangyo Co., Ltd.) at the temperature during discharge.

In terms of forming a cured adhesive layer with even higher accuracy, in the attachment step, it is preferable that the pressure applied during attachment is 0.01 MPa or more, more preferably 0.05 MPa or more, and 10 MPa or less, more preferably 8 MPa.

In terms of forming a cured adhesive layer with even higher accuracy, in the attachment step, it is preferable that the temperature during attachment is 30° C. or more, more preferably 40° C. or more, and 180° C. or less, more preferably 150° C. or less.

The adhesive is photocurable and thermocurable. The adhesive contains a photocurable component and a thermocurable component. It is preferable that the adhesive contains a photocurable compound (curable compound that can be cured by irradiation with light), a thermocurable compound (curable compound that can be cured by heating), a photopolymerization initiator, and a thermal curing agent. It is preferable that the adhesive contains a photocurable compound, a photo- and thermocurable compound (curable compound that can be cured by both irradiation with light and heating), a thermocurable compound, a photopolymerization initiator, and a thermal curing agent. It is preferable that the adhesive contains a curing accelerator.

Hereinafter, the components contained in the adhesive will be described in detail.

(Curable Compound)
(Photocurable Compound)

Examples of photocurable compounds mentioned above include curable compounds having a (meth)acryloyl group, curable compounds having a vinyl group, and curable compounds having a maleimide group. In terms of forming a cured adhesive layer with even higher accuracy, it is preferable that the photocurable compound has a (meth)acryloyl group (at least one). The photocurable compounds may be used alone, and it is also possible to use a combination of two or more kinds.

In this specification, the curable compound having a (meth)acryloyl group mentioned above means a compound having at least either a methacryloyl group or an acryloyl group.

As the photocurable compound, it is possible to use a multifunctional compound (A1) having two or more photoreactive groups or a monofunctional compound (A2) having one photoreactive group.

In terms of forming a cured adhesive layer with even higher accuracy, it is preferable that the adhesive contains, as the photocurable compounds, a monofunctional compound (A2) having one (meth)acryloyl group and a multifunctional compound (A1) having two or more (meth)acryloyl groups.

Examples of multifunctional compounds (A1) mentioned above include (meth)acrylic acid adducts of polyalcohols, (meth)acrylic acid adducts of alkylene-oxide-modified polyalcohols, urethane (meth)acrylates, and polyester (meth)acrylates. Examples of polyalcohols mentioned above include diethylene glycol, triethylene glycol, polyethylene glycol, dipropylene glycol, tripropylene glycol, polypropylene glycol, trimethylolpropane, cyclohexane dimethanol, tricyclodecanedimethanol, alkylene oxide adducts of bisphenol A, and pentaerythritol.

Specific examples of multifunctional compounds (A1) mentioned above include tricyclodecanedimethanol di(meth)acrylate, isobornyl dimethanol di(meth)acrylate, and dicyclopentenyl dimethanol di(meth)acrylate. Among them, in terms of further increasing the wet-heat resistance of a cured product, it is preferable that the multifunctional compound (A1) is tricyclodecanedimethanol di(meth)acrylate.

The term "(meth)acrylate" means acrylate or methacrylate. The term "(meth)acryl" means acryl or methacryl.

It is preferable that the multifunctional compound (A1) is a multifunctional compound (A1) that has a polycyclic skeleton and also has two or more (meth)acryloyl groups. Use of a multifunctional compound (A1) makes it possible to increase the wet-heat resistance of a cured product of the adhesive. Accordingly, the reliability of an electronic component can be increased.

The multifunctional compound (A1) is not particularly limited as long as it has a polycyclic skeleton and also has two or more (meth)acryloyl groups. As the multifunctional compound (A1), it is possible to use a known multifunctional compound that has a polycyclic skeleton and also has two or more (meth)acryloyl groups. The multifunctional compound (A1) has two or more (meth)acryloyl groups, and thus is polymerized by irradiation with light and cured. The multifunctional compounds (A1) may be used alone, and it is also possible to use a combination of two or more kinds.

Specific examples of multifunctional compounds (A1) mentioned above include tricyclodecanedimethanol di(meth)acrylate, isobornyl dimethanol di(meth)acrylate, and dicyclopentenyl dimethanol di(meth)acrylate. Among them, in terms of further increasing the wet-heat resistance of a cured product, it is preferable that the multifunctional compound (A1) is tricyclodecanedimethanol di(meth)acrylate.

The "polycyclic skeleton" in the multifunctional compound (A1) or the below-described monofunctional compound (A2) means a structure having a plurality of cyclic skeletons continuously. As the polycyclic skeletons in the multifunctional compound (A1) and the monofunctional compound (A2), a polycyclic alicyclic skeleton and a polycyclic aromatic skeleton can be mentioned, respectively.

Examples of polycyclic alicyclic skeletons mentioned above include a bicycloalkane skeleton, a tricycloalkane skeleton, a tetracycloalkane skeleton, and an isobornyl skeleton.

Examples of polycyclic aromatic skeletons mentioned above include a naphthalene ring skeleton, an anthracene ring skeleton, a phenanthrene ring skeleton, a tetracene ring skeleton, a chrysene ring skeleton, a triphenylene ring skeleton, a tetraphene ring skeleton, a pyrene ring skeleton, a pentacene ring skeleton, a picene ring skeleton, and a perylene ring skeleton.

Specific examples of monofunctional compounds (A2) mentioned above include isobornyl (meth)acrylate, dihydroxycyclopentadienyl (meth)acrylate, dicyclopentenyl (meth)acrylate, dicyclopentenyloxyethyl (meth)acrylate, dicyclopentanyl (meth)acrylate, and naphthyl (meth)acrylate. Among them, in terms of further increasing the wet-heat resistance of a cured product, it is preferable that the monofunctional compound (A2) is at least one member selected from the group consisting of isobornyl (meth)acrylate, dihydroxycyclopentadienyl (meth)acrylate, dicyclopentenyl (meth)acrylate, dicyclopentenyloxyethyl (meth)acrylate, and dicyclopentanyl (meth)acrylate.

Examples of compounds having a vinyl group mentioned above include vinyl ethers, ethylene derivatives, styrene, chloromethyl styrene, α-methylstyrene, maleic anhydride, dicyclopentadiene, N-vinylpyrrolidone, and N-vinylformamide.

The compound having a maleimide group is not particularly limited, and examples thereof include N-methylmaleimide, N-ethylmaleimide, N-hexylmaleimide, N-propylmaleimide, N-butylmaleimide, N-octylmaleimide, N-dodecylmaleimide, N-cyclohexylmaleimide, N-phenylmaleimide, N-p-carboxyphenylmaleimide, N-p-hydroxyphenylmaleimide, N-p-chlorophenylmaleimide, N-p-tolylmaleimide, N-p-xylylmaleimide, N-o-chlorophenylmaleimide, N-o-tolylmaleimide, N-benzylmaleimide, N-2,5-diethylphenylmaleimide, N-2,5-dimethylphenylmaleimide, N-m-tolylmaleimide, N-α-naphthylmaleimide, N-o-xylylmaleimide, N-m-xylylmaleimide, bismaleimide methane, 1,2-bismaleimide ethane, 1,6-bismaleimide hexane, bismaleimide dodecane, N,N'-m-phenylenedimaleimide, N,N'-p-phenylenedimaleimide, 4,4'-bismaleimide diphenyl ether, 4,4'-bismaleimide diphenylmethane, 4,4'-bismaleimide-di(3-methylphenyl)methane, 4,4'-bismaleimide-di(3-ethylphenyl)methane, 4,4'-bismaleimide-di(3-methyl-5-ethyl-phenyl)methane, N,N'-(2,2-bis-(4-phenoxyphenyl)propane)dimaleimide, N,N'-2,4-tolylene dimaleimide, N,N'-2,6-tolylene dimaleimide, and N,N'-m-xylylenedimaleimide.

In terms of further increasing insulation reliability and adhesion reliability, it is preferable that the photocurable compound has a dicyclopentadiene skeleton.

In terms of forming a cured adhesive layer with even higher accuracy, it is preferable that the photocurable compound content based on 100 wt % of the adhesive is 10 wt % or more, more preferably 20 wt % or more, and 80 wt % or less, more preferably 70 wt % or less.

(Photo- and Thermocurable Compound)

Examples of photo- and thermocurable compounds mentioned above include compounds having various kinds of photocurable functional groups and various kinds of thermocurable functional groups. In terms of forming a cured adhesive layer with even higher accuracy, the photo- and thermocurable compound preferably has a (meth)acryloyl group and a cyclic ether group, and preferably has a (meth)acryloyl group and an epoxy group. The photo- and thermocurable compounds may be used alone, and it is also possible to use a combination of two or more kinds.

The photo- and thermocurable compound is not particularly limited, and examples thereof include compounds having a (meth)acryloyl group and an epoxy group, partially (meth)acrylated epoxy compounds, and urethane-modified (meth)acrylic epoxy compounds.

Examples of compounds having a (meth)acryloyl group and an epoxy group mentioned above include glycidyl (meth) acrylate and 4-hydroxybutyl (meth)acrylate glycidyl ether.

The partially (meth)acrylated epoxy compound is obtained by the reaction between an epoxy compound and a (meth) acrylic acid in the presence of a catalyst in the usual manner. Examples of epoxy compounds usable for the partially (meth) acrylated epoxy compound include novolac epoxy compounds and bisphenol epoxy compounds. Examples of novolac epoxy compounds mentioned above include phenol novolac epoxy compounds, cresol novolac epoxy compounds, biphenyl novolac epoxy compounds, trisphenol novolac epoxy compounds, and dicyclopentadiene novolac epoxy compounds. Examples of bisphenol epoxy compounds mentioned above include bisphenol A epoxy compounds, bisphenol F epoxy compounds, 2,2'-diallylbisphenol A epoxy compounds, hydrogenated bisphenol epoxy compounds, and polyoxypropylene bisphenol A epoxy compounds. An epoxy compound with a desired acrylation proportion can be obtained by suitably changing the amounts of epoxy compound and (meth)acrylic acid to be blended. It is preferable that the amount of carboxylic acid to be blended per equivalent of epoxy group is 0.1 equivalents or more, more preferably 0.2 equivalents or more, and 0.7 equivalents or less, more preferably 0.5 equivalents or less.

The urethane-modified (meth)acrylic epoxy compound is obtained by the following method, for example. A polyol is allowed to react with a bi- or higher functional isocyanate, and further the remaining isocyanate group is allowed to react with a (meth)acrylic monomer having an acid group and glycidol. Alternatively, without using a polyol, a bi- or higher functional isocyanate may be allowed to react with a (meth) acrylic monomer having a hydroxyl group and glycidol. Alternatively, the urethane-modified (meth)acrylic epoxy compound may also be obtained by allowing a (meth)acrylate monomer having an isocyanate group to react with glycidol. Specifically, for example, first, 1 mol of trimethylolpropane is allowed to react with 3 mol of isophorone diisocyanate in the presence of a tin-based catalyst. The isocyanate group remaining in the obtained compound is allowed to react with hydroxyethyl acrylate, which is an acrylic monomer having a hydroxyl group, and glycidol, which is an epoxy having a hydroxyl group, whereby the urethane-modified (meth) acrylic epoxy compound can be obtained.

The polyol is not particularly limited, and examples thereof include ethylene glycol, glycerin, sorbitol, trimethylolpropane, and (poly)propylene glycol.

The isocyanate is not particularly limited as long as it is bi- or higher functional. Examples of isocyanates mentioned above include isophorone diisocyanate, 2,4-tolylene diisocyanate, 2,6-tolylene diisocyanate, hexamethylene diisocyanate, trimethylhexamethylene diisocyanate, diphenylmethane-4,4'-diisocyanate (MDI), hydrogenated MDI, polymeric MDI, 1,5-naphthalene diisocyanate, norbornane diisocyanate, tolidine diisocyanate, xylylene diisocyanate (XDI), hydrogenated XDI, lysine diisocyanate, triphenylmethane triisocyanate, tris(isocyanatephenyl) thiophosphate, tetramethylxylene diisocyanate, and 1,6,10-undecane triisocyanate.

In terms of forming a cured adhesive layer with even higher accuracy, it is preferable that the photo- and thermocurable compound content based on 100 wt % of the adhesive is 0.5 wt % or more, more preferably 1 wt % or more, and 60 wt % or less, more preferably 50 wt % or less.

In terms of forming a cured adhesive layer with even higher accuracy, it is preferable that the total of the photocurable compound content and the photo- and thermocurable compound content based on 100 wt % of the adhesive is 10 wt % or more, more preferably 20 wt % or more, and 80 wt % or less, more preferably 70 wt % or less.

(Thermocurable Compound)

Examples of thermocurable compounds mentioned above include thermocurable compounds having a cyclic ether group and thermocurable compounds having a thiirane group. In terms of forming a cured adhesive layer with even higher accuracy, the thermocurable compound is preferably a thermocurable compound having a cyclic ether group, and more preferably a thermocurable compound having an epoxy group (epoxy compound). The thermocurable compounds may be used alone, and it is also possible to use a combination of two or more kinds.

The epoxy compound is not particularly limited, and examples thereof include novolac epoxy compounds and bisphenol epoxy compounds. Examples of novolac epoxy compounds mentioned above include phenol novolac epoxy compounds, cresol novolac epoxy compounds, biphenyl novolac epoxy compounds, trisphenol novolac epoxy compounds, and dicyclopentadiene novolac epoxy compounds. Examples of bisphenol epoxy compounds mentioned above include bisphenol A epoxy compounds, bisphenol F epoxy compounds, 2,2'-diallylbisphenol A epoxy compounds, hydrogenated bisphenol epoxy compounds, and polyoxypropylene bisphenol A epoxy compounds. Examples of epoxy compounds mentioned above further include cyclic aliphatic epoxy compounds and glycidylamine.

In terms of forming a cured adhesive layer with even higher accuracy, it is preferable that the thermocurable compound content based on 100 wt % of the adhesive is 10 wt % or more, more preferably 20 wt % or more, and 80 wt % or less, more preferably 70 wt % or less.

(Photopolymerization Initiator)

Examples of photopolymerization initiators mentioned above include photo-radical polymerization initiators and photo-cationic polymerization initiators. It is preferable that the photopolymerization initiator is a photo-radical polymerization initiator. The photopolymerization initiators may be used alone, and it is also possible to use a combination of two or more kinds.

The photo-radical polymerization initiator is not particularly limited. The photo-radical polymerization initiator is a compound that generates radicals upon irradiation with light to initiate a radical polymerization reaction. Specific examples of photo-radical polymerization initiators mentioned above include benzoin, benzoin alkylethers, acetophenones, aminoacetophenones, anthraquinones, thioxanthones, ketals, 2,4,5-triarylimidazole dimer, riboflavin tetrabutyrate, thiol compounds, 2,4,6-tris-s-triazine, organic halogen compounds, benzophenones, xanthones, and 2,4,6-trimethylbenzoyl diphenylphosphine oxide. The photo-radical polymerization initiators may be used alone, and it is also possible to use a combination of two or more kinds.

Together with the photo-radical polymerization initiator, a photopolymerization initiation aid may also be used. Examples of photopolymerization initiation aids mentioned above include N,N-dimethylaminobenzoic acid ethyl ester, N,N-dimethylaminobenzoic acid isoamyl ester, pentyl-4-dimethylamino benzoate, triethylamine, and triethanolamine. Other photopolymerization initiation aids may also be used.

The photopolymerization initiation aids may be used alone, and it is also possible to use a combination of two or more kinds.

In addition, a titanocene compound having absorption in the visible light region, such as CGI-784 (manufactured by Ciba Specialty Chemicals), may also be used to promote the photoreaction.

The photo-cationic polymerization initiator is not particularly limited, and examples thereof include sulfonium salts, iodonium salts, metallocene compounds, and benzoin tosylate. The photo-cationic polymerization initiators may be used alone, and it is also possible to use a combination of two or more kinds.

It is preferable that the photopolymerization initiator content based on 100 wt % of the adhesive is 0.1 wt % or more, more preferably 0.2 wt % or more, and 10 wt % or less, more preferably 5 wt % or less.

(Thermal Curing Agent)

Examples of thermal curing agents mentioned above include organic acids, amine compounds, amide compounds, hydrazide compounds, imidazole compounds, imidazoline compounds, phenolic compounds, urea compounds, polysulfide compounds, and acid anhydrides. It is also possible to use a modified polyamine compound, such as an amine-epoxy adduct, as the thermal curing agent. Other thermal curing agents may also be used. The thermal curing agents may be used alone, and it is also possible to use a combination of two or more kinds.

The amine compound means a compound having at least one primary to tertiary amino group. Examples of amine compounds mentioned above include (1) aliphatic polyamines, (2) alicyclic polyamines, (3) aromatic polyamines, (4) hydrazides, and (5) guanidine derivatives. In addition, it is also possible to use adducts, such as an epoxy-compound-added polyamine (reaction product between an epoxy compound and a polyamine), a Michael-added polyamine (reaction product between α,β-unsaturated ketone and a polyamine), a Mannich-added polyamine (condensate of a polyamine, formalin, and phenol), a thiourea-added polyamine (reaction product between thiourea and a polyamine), and a ketone-blocked polyamine (reaction product between a ketone compound and a polyamine [ketimine]).

Examples of (1) aliphatic polyamines mentioned above include diethylenetriamine, triethylenetetramine, tetraethylenepentamine, and diethylamino propylamine.

Examples of (2) alicyclic polyamines mentioned above include menthanediamine, isophoronediamine, N-aminoethylpiperazine, 3,9-bis(3-aminopropyl)-2,4,8,10-tetraoxaspiro(5,5)undecane adduct, bis(4-amino-3-methylcyclohexyl)methane, and bis(4-aminocyclohexyl)methane.

Examples of (3) aromatic polyamines mentioned above include m-phenylenediamine, p-phenylenediamine, o-xylenediamine, m-xylenediamine, p-xylenediamine, 4,4-diaminodiphenylmethane, 4,4-diaminodiphenylpropane, 4,4-diaminodiphenylsulfone, 4,4-diaminodicyclohexane, bis(4-aminophenyl)phenylmethane, 1,5-diaminonaphthalene, 1,1-bis(4-aminophenyl)cyclohexane, 2,2-bis[(4-aminophenoxy)phenyl]propane, bis[4-(4-aminophenoxy)phenyl]sulfone, 1,3-bis(4-aminophenoxy)benzene, 4,4-methylene-bis(2-chloroaniline), and 4,4-diaminodiphenylsulfone.

Examples of (4) hydrazides mentioned above include carbodihydrazide, adipic acid dihydrazide, sebacic acid dihydrazide, dodecanedioic acid dihydrazide, and isophthalic acid dihydrazide.

Examples of (5) guanidine derivatives mentioned above include dicyandiamide, 1-o-tolyldiguanide, α-2,5-dimethylguanide, α,ω-diphenyldiguanide, α,α-bisguanyl guanidino diphenyl ether, p-chlorophenyldiguanide, α,α-hexamethylene bis[ω-(p-chlorophenol)]diguanide, phenyldiguanide oxalate, acetylguanidine, and diethylcyanoacetylguanidine.

Examples of phenolic compounds mentioned above include polyphenol compounds. Examples of polyphenol compounds mentioned above include phenol, cresol, ethylphenol, butylphenol, octylphenol, bisphenol A, tetrabromobisphenol A, bisphenol F, bisphenol S, 4,4'-biphenylphenol, a phenol novolac resin having a naphthalene skeleton, a phenol novolac resin having a xylylene skeleton, a phenol novolac resin having a dicyclopentadiene skeleton, and a phenol novolac resin having a fluorene skeleton.

Examples of acid anhydrides mentioned above include phthalic anhydride, tetrahydrophthalic anhydride, hexahydrophthalic anhydride, methyltetrahydrophthalic anhydride, methylnadic anhydride, dodecylsuccinic anhydride, chlorendic anhydride, pyromellitic dianhydride, benzophenone tetracarboxylic anhydride, methylcyclohexene tetracarboxylic anhydride, trimellitic anhydride, and polyazelaic anhydride.

It is preferable that the thermal curing agent content based on 100 wt % of the adhesive is 1 wt % or more, more preferably 5 wt % or more, and 60 wt % or less, more preferably 50 wt % or less.

(Curing Accelerator)

Examples of curing accelerators mentioned above include tertiary amine, imidazole, quaternary ammonium salts, quaternary phosphonium salts, organic metal salts, phosphorus compounds, and urea compounds.

It is preferable that the curing accelerator content based on 100 wt % of the adhesive is 0.01 wt % or more, more preferably 0.1 wt % or more, and 10 wt % or less, more preferably 5 wt % or less.

(Other Components)

The adhesive may also contain other components. Examples of other components include, but are not particularly limited to, adhesion aids such as coupling agents, pigments, dyes, leveling agents, defoaming agents, and polymerization inhibitors.

Hereinafter, other specific examples of electronic components obtained by the method for producing an electronic component according to the present invention will be described.

Figure 6:
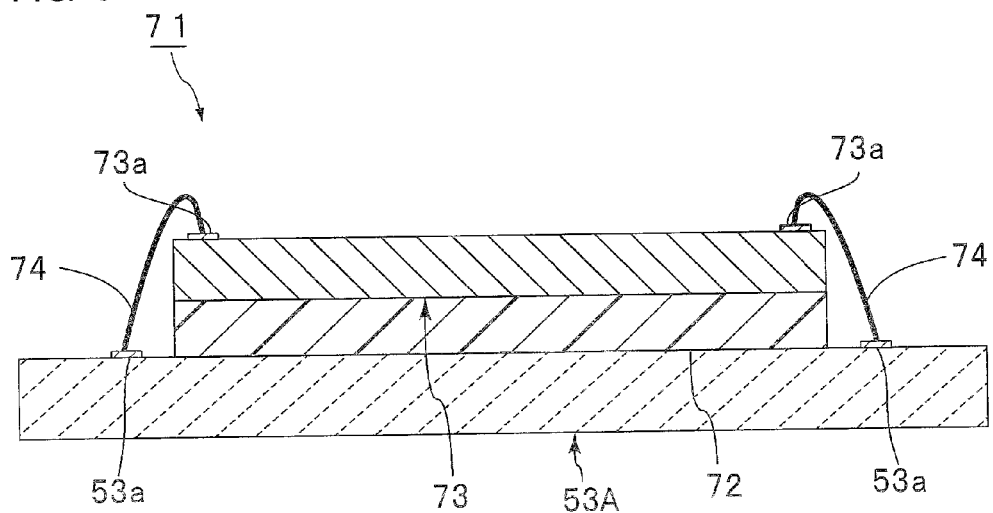
FIG. 6 is a front cross-sectional view schematically showing a first variation of an electronic component obtained by the method for producing an electronic component according to the present invention.

FIG. 6 is a front cross-sectional view schematically showing a first variation of an electronic component obtained by the method for producing an electronic component according to the present invention.

The semiconductor device 71 shown in FIG. 6 is an electronic component. The semiconductor device 71 is provided with a substrate 53A, an adhesive layer 72, and a first semiconductor wafer 73. The substrate 53A has a first connection terminal 53*a* on the upper surface thereof. The first semiconductor wafer 73 has a connection terminal 73*a* on the upper surface thereof. The substrate 53A is formed in the same manner as the below-described substrate 53, except that a second connection terminal 53*b* is not provided.

The first semiconductor wafer 73 is laminated on the substrate 53A through the adhesive layer 72. The adhesive layer 72 is formed by photocuring and thermocuring an adhesive that is photocurable and thermocurable and also is in liquid form.

The first semiconductor wafer 73 has the connection terminal 73*a* on the upper surface thereof. An electrical wire 74 extends from the connection terminal 73*a*. The connection terminal 73*a* and the first connection terminal 53*a* are electrically connected to each other by the electrical wire 74.

Figure 7:
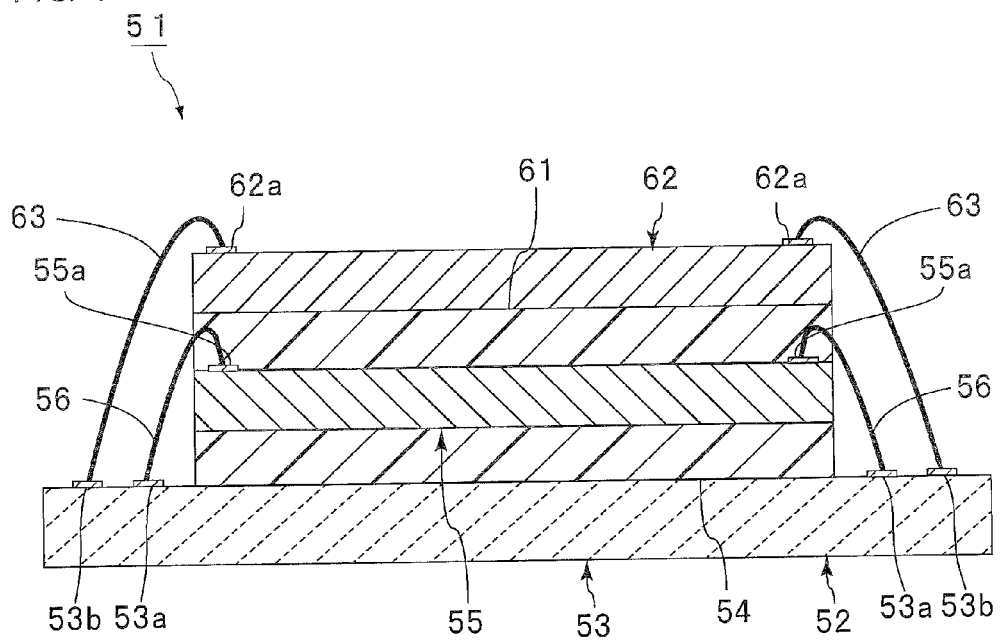
FIG. 7 is a front cross-sectional view schematically showing a second variation of an electronic component obtained by the method for producing an electronic component according to the present invention.

FIG. 7 is a front cross-sectional view schematically showing a second variation of an electronic component obtained by the method for producing an electronic component according to the present invention.

The semiconductor device 51 shown in FIG. 7 is an electronic component. The semiconductor device 51 is provided with a laminated structure 52. The laminated structure 52 has a substrate 53, an adhesive layer 54, and a second semiconductor wafer 55 laminated on the substrate 53 through the adhesive layer 54. The second semiconductor wafer 55 is disposed on the substrate 53. The second semiconductor wafer 55 is indirectly laminated on the substrate 53. In plan view, the substrate 53 is larger than the second semiconductor wafer 55. The substrate 53 has a region that projects laterally more than does the second semiconductor wafer 55.

The adhesive layer 54 is formed by curing a curable composition, for example. A curable composition layer using a curable composition before curing may be sticky. For the formation of a curable composition layer before curing, a curable composition sheet may be used.

The substrate 53 has a first connection terminal 53a on the upper surface thereof. The second semiconductor wafer 55 has a connection terminal 55a on the upper surface thereof. An electrical wire 56 extends from the connection terminal 55a. One end of the electrical wire 56 is connected to the connection terminal 55a provided on the second semiconductor wafer 55. The other end of the electrical wire 56 is connected to the first connection terminal 53a provided on the substrate 53. The connection terminal 55a and the first connection terminal 53a are electrically connected to each other by the electrical wire 56. The other end of the electrical wire 56 may also be connected to a connection terminal other than the first connection terminal 53a. It is preferable that the electrical wire 56 is a bonding wire.

On the second semiconductor wafer 55 in the laminated structure 52, a first semiconductor wafer 62 is laminated through an adhesive layer 61. The adhesive layer 61 is formed by photocuring and thermocuring an adhesive that is photocurable and thermocurable and also is in liquid form.

The substrate 53 has a second connection terminal 53b on the upper surface thereof. The first semiconductor wafer 62 has a connection terminal 62a on the upper surface thereof. An electrical wire 63 extends from the connection terminal 62a. One end of the electrical wire 63 is connected to the connection terminal 62a provided on the first semiconductor wafer 62. The other end of the electrical wire 63 is connected to the second connection terminal 53b provided on the substrate 53. The connection terminal 62a and the second connection terminal 53b are electrically connected to each other by the electrical wire 63. The other end of the electrical wire 63 may also be connected to a connection terminal other than the second connection terminal 53b. It is preferable that the electrical wire 63 is a bonding wire.

The semiconductor device 51 can be obtained by discharging an adhesive that is photocurable and thermocurable and also is in liquid form from an ink jet device onto the second semiconductor wafer 55, thereby forming the adhesive layer 61. Meanwhile, the semiconductor device 71 can be obtained by discharging an adhesive that is photocurable and thermocurable and also is in liquid form from an ink jet device onto the substrate 53A, thereby forming the adhesive layer 72.

Hereinafter, the present invention will be described in detail with reference to examples and comparative examples. The present invention is not limited to the following examples.

Synthesis Example 1

Fifty gram of methyl cellosolve, 15 g of dicyandiamide, and 1 g of 2,4-diamino-6-[2'-undecylimidazolyl-(1')]-ethyl-s-triazine were added to a three-neck separable flask provided with a stirrer, a thermometer, and a dropping funnel, and heated to 100° C. to dissolve dicyandiamide. After dissolution, 130 g of butyl glycidyl ether was added dropwise thereto over 20 minutes from the dropping funnel and allowed to react for 1 hour. The temperature was then lowered to 60° C., and the pressure was reduced to remove the solvent, thereby giving a faint yellow, viscous reaction product (thermal curing agent A).

(Preparation of Adhesive A)

Fifty parts by weight of tricyclodecanedimethanol diacrylate (IRR-214K, manufactured by Daicel-Allnex Ltd.) as a photocurable compound, 10 parts by weight of an acrylic acid adduct of a bisphenol A epoxy resin (UVACURE1561, manufactured by Daicel-Allnex Ltd.) as a photo- and thermocurable compound, 40 parts by weight of a bisphenol A epoxy compound (EXA850CRP, manufactured by DIC Corporation) as a thermocurable compound, 40 parts by weight of a terpene-based acid anhydride compound (YH 309, manufactured by Mitsubishi Chemical Corporation) as a thermal curing agent, 1 part by weight of a DBU-octylic acid salt (UC-ATSA102, manufactured by San-Apro Ltd.) as a curing accelerator, and 5 parts by weight of 2-benzyl-2-dimethylamino-4-morpholinobutyrophenone (IRGACURE369, manufactured by BASF) as a photopolymerization initiator were uniformly mixed to give an adhesive A.

At the circulation temperature during the below-described application test and semiconductor device (laminated structure) production (the temperature during discharge), the viscosity of the obtained adhesive A at 10 rpm was measured using a viscometer ("TVE22L" manufactured by Toki Sangyo Co., Ltd.).

(Preparation of Adhesives B to I)

Preparation was performed in the same manner as in the preparation of the adhesive A, except that the components shown in the following Table 1 were blended in the blending amounts shown in the following Table 2. The viscosity of the obtained adhesives B to I was also measured in the same manner as for the viscosity of the adhesive A.

TABLE 1

| | | | |
|---|---|---|---|
| Photocurable compound | TMPTA | Trimethylolpropane triacrylate | Manufactured by Daicel-Allnex Ltd. |
| | IRR-214K | Tricyclodecanedimethanol diacrylate | Manufactured by Daicel-Allnex Ltd. |
| Photo- and thermocurable compound | UVACURE1561 | Acrylic acid adduct of bisphenol A epoxy resin | Manufactured by Daicel-Allnex Ltd. |
| | GMA | Glycidyl methacrylate | Manufactured by NOF Corporation |
| Thermocurable compound | EXA850CRP | Bisphenol A epoxy compound | Manufactured by DIC Corporation |

TABLE 1-continued

| | | | |
|---|---|---|---|
| | YDF-170 | Bisphenol F epoxy compound | Manufactured by Nippon Steel & Sumikin Chemical Co., Ltd. |
| | PETG | Aliphatic epoxy compound | Manufactured by Showa Denko K.K. |
| Photopolymerization initiator | IRGACURE369 | 2-Benzyl-2-dimethylamino-4-morpholinobutyrophenone | Manufactured by BASF |
| Thermal curing agent | YH309 | Terpene-based acid anhydride compound | Manufactured by Mitsubishi Chemical Corporation |
| | Thermal curing agent A | Thermal curing agent obtained in Synthesis Example 1 | Manufactured by Sekisui Chemical Co., Ltd. |
| Curing accelerator | UCAT SA102 | DBU-octylic acid salt | Manufactured by San-Apro Ltd. |

TABLE 2

| | | Adhesive A | Adhesive B | Adhesive C | Adhesive D | Adhesive E |
|---|---|---|---|---|---|---|
| Photocurable compound | TMPTA | | | | 35 | |
| | IRR-214K | 50 | 50 | 40 | 35 | 20 |
| Photo- and thermocurable compound | UVACURE 1561 | 10 | | 5 | | |
| | GMA | | | 5 | 5 | 10 |
| Thermocurable compound | EX850CRP | 40 | 50 | 50 | | 70 |
| | YDF-170 | | | | 25 | |
| | PETG | | | | | |
| Photopolymerization initiator | IRGACURE369 | 5 | 5 | 5 | 5 | 5 |
| Thermal curing agent | YH309 | 40 | 50 | 60 | 30 | 70 |
| | Thermal curing agent A | | | | | |
| Curing accelerator | UCATSA102 | 1 | 1 | 1 | 1 | 1 |

| | | Adhesive F | Adhesive G | Adhesive H | Adhesive I |
|---|---|---|---|---|---|
| Photocurable compound | TMPTA | 35 | | | 50 |
| | IRR-214K | 35 | 20 | | 50 |
| Photo- and thermocurable compound | UVACURE 1561 | | | | |
| | GMA | 5 | 10 | | |
| Thermocurable compound | EX850CRP | 25 | 70 | 30 | |
| | YDF-170 | | | 50 | |
| | PETG | | | 20 | |
| Photopolymerization initiator | IRGACURE369 | 5 | 5 | | 5 |
| Thermal curing agent | YH309 | | | 100 | |
| | Thermal curing agent A | 6 | 16 | | |
| Curing accelerator | UCATSA102 | 1 | 1 | 1 | 1 |

Example 1

(1) Discharge Test

An FR4 glass epoxy substrate (0.3 mm thick, having a commercially available solder resist applied thereto, and provided with regions to place a 10 mm long×10 mm wide semiconductor chip in 3 lines×9 rows, 27 in total) was prepared. In accordance with the method for producing an electronic component according to one embodiment of the present invention mentioned above, the steps shown in FIGS. 1(a) to (e) were performed (however, the conditions were set as shown below in Table 3) to form an adhesive layer. The application step, in which the adhesive A was applied while being circulated, and the first light irradiation step were repeated, thereby forming an adhesive layer having a thickness of 30 μm. The adhesive layer was formed on the 10×10 mm region to mount a semiconductor chip, and 27 samples for the discharge test and evaluation were produced.

(2) Semiconductor Device (Laminated Structure) Production

An FR4 glass epoxy substrate (0.3 mm thick, having a commercially available solder resist applied thereto, and provided with regions to place a 10 mm long×10 mm wide semiconductor chip in 3 lines×9 rows, 27 in total) was prepared. In accordance with the method for producing an electronic component according to one embodiment of the present invention mentioned above, the steps shown in FIGS. 1(a) to (e) were performed (however, the conditions were set as shown below in Table 3) to form an adhesive layer. The application step, in which the adhesive A was applied while being circulated, and the first light irradiation step were repeated, thereby forming an adhesive layer having a thickness of 30 μm. Subsequently, on the adhesive layer, using a die bonding device, a silicon bare chip likened to a semiconductor chip (10 mm long×10 mm wide×80 μm thick) was laminated under the condition of 1.0 MPa at 110° C., thereby giving a laminate. After laminating the silicon bare chip, using an optical microscope (Digital microscope VH-Z100, manufactured by Keyence Corp.), it was confirmed that the protrusion of the adhesive layer was less than 100 μm. The obtained laminates were placed in an oven at 160° C., heated for 3 hours, and thus thermocured, thereby giving 27 semiconductor devices (laminated structures).

Examples 2 to 13 and Comparative Examples 1 to 4

Semiconductor devices were produced in the same manner as in Example 1, except that the adhesive and the production conditions were changed as shown below in Table 3.

However, with respect to the lamination of silicon bare chips in Comparative Example 3, lamination was performed under the condition of 0.2 MPa at 40° C.

(Evaluation)

(1) Evaluation of Substrate after Adhesive Layer Formation (Examination of Discharge Failure)

The adhesive layers (27 patterns) were examined under a stereoscopic microscope ("SMZ-10" manufactured by Nikon Corporation) to examine the escape of liquid.

[Criteria for Discharge Failure]

○: No pattern had failure.

Δ: 1 or more and less than 5 patterns had failure.

x: 5 or more patterns had failure.

(2) Examination of Voids in Semiconductor Device

Using an ultrasonic inspection imaging device ("mi-scope hyper II, manufactured by Hitachi Construction Machinery Finetec Co., Ltd.), voids in the adhesive layers of the obtained semiconductor devices were observed and evaluated based on the following criteria.

[Criteria for Voids]

○○: Voids were hardly observed.

○: Voids were slightly observed (not problematic in use).

x: Voids were observed (problematic in use).

(3) Examination of Protrusion of Adhesive Layer of Semiconductor Device

Using a stereoscopic microscope ("SMZ-10" manufactured by Nikon Corporation), the protrusion of the adhesive layers of the obtained semiconductor devices was observed and evaluated based on the following criteria.

[Criteria for Protrusion]

○: Protrusion was hardly observed (the amount of protrusion: less than 100 μm).

x: Protrusion was observed (the amount of protrusion: 100 μm or more).

(4) Moisture Absorption Reflow Test on Semiconductor Device

The obtained semiconductor devices (27 devices) were allowed to stand at 85° C. and 85RH % for 168 hours to absorb moisture, and then passed through a solder reflow furnace (preheated at 150° C.×100 seconds, reflow [maximum temperature: 260° C.]) for 1 cycle and 3 cycles. With respect to these semiconductor devices, using an ultrasonic inspection imaging device (mi-scope hyper II, manufactured by Hitachi Construction Machinery Finetec Co., Ltd.), the separation of the adhesive layers of the semiconductor devices was observed and evaluated based on the following criteria.

[Criteria for Moisture Absorption Reflow Test]

○○: No separation

○: Separation in 1 or more and less than 3 devices (not problematic in use)

x: Separation in 3 or more devices (problematic in use).

(5) Evaluation of Adhesion Reliability (Long-Term Reliability: Hot-Cold Cycle Evaluation)

Using a liquid-bath-type thermal shock tester ("TSB-51" manufactured by ESPEC Corporation), the obtained semiconductor devices were subjected to a hot-cold cycle test, in which one cycle includes holding at −55° C. for 5 minutes, then heating to 150° C., holding at 150° C. for 5 minutes, and then cooling to −50° C. The semiconductor devices were taken out after 250 cycles and 500 cycles. Using an ultrasonic inspection imaging device (mi-scope hyper II, manufactured by Hitachi Construction Machinery Finetec Co., Ltd.), the separation of the adhesive layers of the obtained semiconductor devices was observed and evaluated based on the following criteria.

[Criteria for Cold-Heat Cycle Evaluation]

○○: No separation

Δ: Slight separation (not problematic in use)

x: Significant separation (problematic in use)

The results are shown in the following Table 3.

TABLE 3

| | Ex. 1 | Ex. 2 | Ex. 3 | Ex. 4 | Ex. 5 | Ex. 6 | Ex. 7 | Ex. 8 | Ex. 9 |
|---|---|---|---|---|---|---|---|---|---|
| Adhesive | A | A | A | A | A | A | A | B | C |
| Viscosity (mPa · s) | 43 | 43 | 43 | 620 | 421 | 26 | 21 | 37 | 34 |
| Ink jet head | Piezoelectric head | | | | | | | | |
| Circulation 1 temperature * | 80° C. | 80° C. | 80° C. | 30° C. | 40° C. | 100° C. | 100° C. | 80° C. | 80° C. |
| Circulation velocity *2 | 30 ml/min | 30 ml/min | 30 ml/min | 30 ml/min | 30 ml/min | 30 ml/min | 30 ml/min | 30 ml/min | 30 ml/min |
| Buffer tank | Present | Present | Absent | Present | Present | Present | Present | Present | Present |
| First light irradiation (mJ/cm$^2$) *3 | 50 | 50 | 50 | 50 | 50 | 50 | 50 | 50 | 50 |

TABLE 3-continued

| | | | | | | | | | | |
|---|---|---|---|---|---|---|---|---|---|---|
| Second light irradiation (mS/cm²) *4 | | Absent | 2000 | 2000 | 2000 | 2000 | 2000 | 2000 | 2000 | 2000 |
| Heating | | | | | | 16° C. × 3 hr | | | | |
| (1) Discharge failure | | ○ | ○ | ○ | ○ | ○ | ○ | ○ | ○ | ○ |
| (2) Examination of voids | | ○○ | ○○ | ○ | ○ | ○○ | ○○ | ○ | ○○ | ○○ |
| (3) Examination of protrusion | | ○ | ○ | ○ | ○ | ○ | ○ | ○ | ○ | ○ |
| (4) Moisture absorption reflow test | 1 cycle | ○ | ○○ | ○○ | ○○ | ○○ | ○○ | ○○ | ○○ | ○○ |
| | 3 cycle | ○ | ○○ | ○○ | ○○ | ○○ | ○○ | ○○ | ○ | ○○ |
| (5) Cold-heat cycle test | 250 cycle | ○ | ○○ | ○○ | ○○ | ○○ | ○○ | ○○ | ○○ | ○○ |
| | 500 cycle | ○ | ○○ | ○ | ○ | ○○ | ○○ | ○ | ○ | ○○ |

| | | Ex. 10 | Ex. 11 | Ex. 12 | Ex. 13 | Comp. Ex. 1 | Comp. Ex. 2 | Comp. Ex. 3 | Comp. Ex. 4 |
|---|---|---|---|---|---|---|---|---|---|
| Adhesive | | D | E | F | G | A | A | H | I |
| Viscosity (mPa · s) | | 9 | 62 | 12 | 84 | 43 | 43 | 250 | 7 |
| Ink jet head | | | | | Piezoelectric head | | | | |
| Circulation 1 temperature * | | 80° C. | 80° C. | 80° C. | 80° C. | 80° C. *5 | 80° C. *5 | 80° C. | 80° C. |
| Circulation velocity *2 | | 30 ml/min | 30 ml/min | 30 ml/min | 30 ml/min | Not circulated | Not circulated | 30 ml/min | 30 ml/min |
| Buffer tank | | Present | Present | Present | Present | Absent | Absent | Present | Present |
| First light irradiation (mJ/cm²) *3 | | 50 | 50 | 50 | 50 | 50 | 50 | Absent | 50 |
| Second light irradiation (mS/cm²) *4 | | 2000 | 2000 | 2000 | 2000 | Absent | 2000 | Absent | 2000 |
| Heating | | | | | 16° C. × 3 hr | | | | Absent |
| (1) Discharge failure | | ○ | ○ | ○ | ○ | X | X | ○ | ○ |
| (2) Examination of voids | | ○○ | ○○ | ○○ | ○○ | X | X | ○ | ○○ |
| (3) Examination of protrusion | | ○ | ○ | ○ | ○ | ○ | ○ | X | ○ |
| (4) Moisture absorption reflow test | 1 cycle | ○○ | ○○ | ○○ | ○○ | ○ | ○○ | ○ | X |
| | 3 cycle | ○○ | ○○ | ○○ | ○○ | X | ○ | X | X |
| (5) Cold-heat cycle test | 250 cycle | ○○ | ○○ | ○○ | ○○ | ○ | ○ | ○ | X |
| | 500 cycle | ○○ | ○○ | ○○ | ○○ | X | X | X | X |

*1 Heated using a heating heater placed in the ink tank
*2 Circulated using a pump
*3 Irradiated using a UV-LED having an irradiation intensity of 50 mW/cm² at 365 nm
*4 Irradiated using an ultrahigh-pressure mercury lamp having an irradiation intensity of 100 mW/cm² at 365 nm
*5 Heated only at the head part

EXPLANATION OF SYMBOLS

1 . . . Electronic component
1A . . . Primary laminate
2 . . . First electronic component body
3 . . . Adhesive layer (after heating)
4 . . . Second electronic component body
11, 11X . . . Ink jet device
12 . . . Adhesive layer
12A . . . Adhesive layer irradiated with light from the first light irradiation part
12B . . . Adhesive layer irradiated with light from the second light irradiation part
13 . . . First light irradiation part
14 . . . Second light irradiation part
21 . . . Ink tank
22 . . . Discharge part
23, 23X . . . Circulation flow path part
23A . . . Buffer tank
23B . . . Pump
31 . . . Electronic component
32 . . . Multilayer adhesive layer (after heating)
32A, 32B, 32C . . . Adhesive layer (after heating)
51, 71 . . . Semiconductor device
52 . . . Laminated structure
53, 53A . . . Substrate
53a . . . First connection terminal
53b . . . Second connection terminal
54, 61, 72 . . . Adhesive layer
55 . . . Second semiconductor wafer
55a, 73a . . . Connection terminal
56, 63, 74 . . . Electrical wire
62, 73 . . . First semiconductor wafer
62a . . . Connection terminal

The invention claimed is:

1. A method for producing an electronic component, comprising:

an application step in which an adhesive that is photocurable and thermocurable and also is in liquid form is applied onto a first electronic component body using an ink jet device to form an adhesive layer;

a first light irradiation step in which, after the application step, the adhesive layer is irradiated with light from a first light irradiation part to allow the curing of the adhesive layer to proceed;

an attachment step in which, after the first light irradiation step, a second electronic component body is disposed on the adhesive layer irradiated with light, and pressure is applied to attach the first electronic component body and the second electronic component body through the adhesive layer irradiated with light, thereby giving a primary laminate; and a heating step in which, after the attachment step, the primary laminate is heated to cure the adhesive layer between the first electronic component body and the second electronic component body, thereby giving an electronic component, the ink jet device including:

an ink tank to store the adhesive;

a discharge part that is connected to the ink tank and discharges the adhesive; and a circulation flow path part that is connected to the discharge part at one end and connected to the ink tank at the other end, through which the adhesive flows, the application step being such that, in the ink jet device, the adhesive is moved from the ink tank to the discharge part, and then the adhesive that has not been discharged from the discharge part is moved through the circulation flow path part to the ink tank, whereby the adhesive is applied while being circulated.

2. The method for producing an electronic component according to claim 1, further comprising, after the first light irradiation step and before the attachment step, a second light irradiation step in which the adhesive irradiated with light from the first light irradiation part is irradiated with light from a second light irradiation part that is different from the first light irradiation part to allow the curing of the adhesive to further proceed.

3. The method for producing an electronic component according to claim 1, wherein the circulation flow path part includes, in the circulation flow path part, a buffer tank to temporarily store the adhesive.

4. The method for producing an electronic component according to claim 1, wherein the temperature of the adhesive during circulation is 40° C. or more and 100° C. or less.

5. The method for producing an electronic component according to claim 1, wherein the ink jet device is an ink jet device using a piezoelectric ink jet head, and, in the application step, the adhesive is applied by the action of a piezo element.

6. The method for producing an electronic component according to claim 1, wherein, in the attachment step, the pressure applied during attachment is 0.01 MPa or more and 10 MPa or less.

7. The method for producing an electronic component according to claim 1, wherein, in the attachment step, the temperature during attachment is 30° C. or more and 180° C. or less.

8. The method for producing an electronic component according to claim 1, wherein the viscosity of the adhesive during discharge is 3 mPa·s or more and 2000 mPa·s or less.

9. The method for producing an electronic component according to claim 1, wherein the adhesive contains a photocurable compound, a thermocurable compound, a photopolymerization initiator, and a thermal curing agent.

10. The method for producing an electronic component according to claim 9, wherein the adhesive contains the photocurable compound, a photo- and thermocurable compound, the thermocurable compound, the photopolymerization initiator, and the thermal curing agent.

11. The method for producing an electronic component according to claim 10, wherein the photocurable compound has a (meth)acryloyl group, the photo- and thermocurable compound has a (meth)acryloyl group and a cyclic ether group, and the thermocurable compound has a cyclic ether group.

12. The method for producing an electronic component according to claim 9, wherein the adhesive contains, as the photocurable compounds, a monofunctional compound having one (meth)acryloyl group and a multifunctional compound having two or more (meth)acryloyl groups.

13. The method for producing an electronic component according to claim 10, wherein the adhesive contains a photo- and thermocurable compound, and the total of the photocurable compound content and the photo- and thermocurable compound content is 10 wt % or more and 80 wt % or less based on 100 wt % of the adhesive.

14. The method for producing an electronic component according to claim 1, wherein the first electronic component body is a circuit board or a semiconductor wafer after dicing.

15. The method for producing an electronic component according to claim 14, wherein the second electronic component body is a semiconductor wafer after dicing.

16. The method for producing an electronic component according to claim 1, wherein an electronic component for a semiconductor device is obtained.

* * * * *